United States Patent
Ma et al.

(10) Patent No.: US 9,009,010 B2
(45) Date of Patent: Apr. 14, 2015

(54) SYSTEMS AND METHODS FOR HYDRAULIC FRACTURE CHARACTERIZATION USING MICROSEISMIC EVENT DATA

(75) Inventors: Jianfu Ma, Houston, TX (US); Kenneth E. Williams, Houston, TX (US)

(73) Assignee: Landmark Graphics Corporation, Houston, TX (US)

( * ) Notice: Subject to any disclaimer, the term of this patent is extended or adjusted under 35 U.S.C. 154(b) by 0 days.

(21) Appl. No.: 13/979,752

(22) PCT Filed: Apr. 15, 2011

(86) PCT No.: PCT/US2011/032741
§ 371 (c)(1),
(2), (4) Date: Jul. 15, 2013

(87) PCT Pub. No.: WO2012/141720
PCT Pub. Date: Oct. 18, 2012

(65) Prior Publication Data
US 2013/0304437 A1    Nov. 14, 2013

(51) Int. Cl.
G06F 7/60 (2006.01)
G06F 17/10 (2006.01)
G06F 17/50 (2006.01)
G01V 1/28 (2006.01)

(52) U.S. Cl.
CPC ............ *G06F 17/5009* (2013.01); *G01V 1/288* (2013.01); *G01V 2210/1234* (2013.01)

(58) Field of Classification Search
None
See application file for complete search history.

(56) References Cited

U.S. PATENT DOCUMENTS

| | | | |
|---|---|---|---|
| 4,698,759 A | 10/1987 | Eliason et al. | |
| 5,661,698 A | 8/1997 | Cacas | |
| 5,798,768 A | 8/1998 | Cacas | |
| 5,996,726 A * | 12/1999 | Sorrells et al. | 181/106 |
| 6,985,816 B2 | 1/2006 | Sorrells et al. | |
| 7,254,091 B1 | 8/2007 | Gunning et al. | |
| 7,391,675 B2 | 6/2008 | Drew | |
| 7,460,436 B2 | 12/2008 | Segall et al. | |
| 7,660,199 B2 | 2/2010 | Drew | |
| 7,746,725 B2 | 6/2010 | Akhtar | |
| 7,777,606 B2 | 8/2010 | Akbar et al. | |
| 7,869,954 B2 | 1/2011 | den Boer et al. | |
| 2005/0060099 A1 | 3/2005 | Sorrells et al. | |
| 2005/0143917 A1 * | 6/2005 | Jo et al. | 701/224 |
| 2006/0081412 A1 * | 4/2006 | Wright et al. | 181/104 |
| 2007/0183260 A1 * | 8/2007 | Lee et al. | 367/25 |
| 2008/0004847 A1 | 1/2008 | Bradford | |
| 2009/0259406 A1 | 10/2009 | Khadhraoui et al. | |

(Continued)

FOREIGN PATENT DOCUMENTS

WO    2005089404 A2    9/2005
WO    2005089404 A3    9/2005

OTHER PUBLICATIONS

Blaine R. Copenheaver, The International Search Report and the Written Opinion of the International Searching Authority, PCT/US2011/032741, Nov. 22, 2013, 6 pages, ISA/US.

(Continued)

*Primary Examiner* — Omar Fernandez Rivas
*Assistant Examiner* — Bernard E Cothran
(74) *Attorney, Agent, or Firm* — Crain, Caton & James; John Wustenberg (57) ABSTRACT

Systems and methods for hydraulic fracture characterization using microseismic event data to identify the orientation spacing and dip for subsurface fractures.

20 Claims, 6 Drawing Sheets

(56) References Cited

U.S. PATENT DOCUMENTS

| | | | |
|---|---|---|---|
| 2010/0149913 | A1 | 6/2010 | Savary-Sismondini et al. |
| 2010/0157730 | A1 | 6/2010 | Bradford |
| 2010/0232259 | A1 | 9/2010 | Akhtar |
| 2010/0238765 | A1 | 9/2010 | Grechka et al. |
| 2010/0256964 | A1 | 10/2010 | Lee et al. |
| 2010/0262373 | A1 | 10/2010 | Khadhraoui |
| 2010/0307755 | A1 | 12/2010 | Xu et al. |
| 2010/0312529 | A1 | 12/2010 | Souche et al. |
| 2011/0029291 | A1 | 2/2011 | Weng et al. |
| 2011/0029293 | A1 | 2/2011 | Petty et al. |
| 2011/0044131 | A1 | 2/2011 | Thornton et al. |
| 2013/0081805 | A1* | 4/2013 | Bradford et al. ........... 166/250.1 |

OTHER PUBLICATIONS

John Nguen, International Preliminary Report on Patentability, PCT/US2011/032741, May 3, 2013, 6 pages, ISA/US.

Evans et al. Induced Seismicity and Flow in Deep Granite. 2004. Royal Astronomical 1-20 Society. GJI [Retrieved on Nov. 8, 2011]. pp. 389-412 [Retrieved from the internet: <http://articles.adsabs.harvard .edu/cgi-bin/nph-iarticle_query?2005GeoJI.160 .. 389E&defaultprint=YES&filetype= .pdf>).

Maxwell et al. Key Criteria for a Successful Microseismic Project. Sep. 19-22, 2010. 1-20 Society of Petroleum Engineers. SPE Annual Technical Conference and Exposition [Retrieved on Nov. 8, 2011). pp. 1-2 [Retrieved from the internet: <http://www.onepetro.org/mslib/app/Preview.do?paperNumber=SPE -134695-MS &societyCode=SPE>].

Williams, M. J., Khadhraoui, B. & Bradford, I.; Quantitative Interpretation of Major Planes From Microseismic Event Locations With Application in Production Prediction; SEG 2010 Denver Annual Meeting, Expanded Abstracts; pp. 2085-2089.

Fisher, M. K., Heinze, J.R., Harris, C.D., Davidson, B.M., Wright, C.A. & Dunn, K.P.; Optimizing Horizontal Completion Technologies in the Barnett Shale Using Microseismic Fracture Mapping; SPE-90051; 2002;12 pgs.

Daniels , J., Waters, G., Calvez, J. Le, Lassek, J. & Bently, D.; Contacting More of the Barnett Shale Through an Integration of Real-time Microseismic Monitoring, Petrophysics, and Hydraulic Fracture Design; SPE-110562; 2007; 2 pgs.

Mayerhofer, M. J., Lolon, E.P., Warpinski, N.R., Cipolla, C.L., Walser, D., & C. M. Rightmire; What Is Stimulated Reservoir Volume (SRV)?; SPE-119890; 2008; 14 pgs.

Charles Berko, Patent Examination Report No. 2, Patent Application No. 2011365515, Mar. 26, 2014, 4 pages, Australian Government IP Australia, Australia.

Colin D MacAuley, Response to 2nd Exam report, Patent Application No. 2011365515, May 12, 2014, 4 pages, Callinas, Australia.

Charles Berko, Patent Examination Report No. 1, Patent Application No. 2011365515, Nov. 25, 2013, 8 pages, Australian Government IP Australia Australia.

Jing Du et al, "Fault-Plane Solutions from Moment Tensor Inversion for Microseismic Events using Single-Well and Mulit-Well Data" Pinnacle—A Halliburton Service, Canadian Society of Exploration Geophysics, Oct. 2011, 7 pages, Canada.

Norm Warpinski, "Microseismic Monitoring: Inside and Out", Distinguished Author Series, JPT, Nov. 2009, 6 pages.

Fuxian Song et al, "Full-waveform Based Complete Moment Tensor Inversion and Stress Estimation from Downhole Microseismic Data for Hydrofracture Monitoring", Earth Resources Laboratory, Massachusetts Institute of Technology, Dec. 27, 2011, 32 pages, Cambridge, Ma.

Colin D MacAuley, Response to 1st Exam report, Patent Application No. 2011365515, Feb. 19, 2014, 33 pages, Callinas, Australia.

Thorsten Vollmer, Supplementary European Search Report, Application No. 11863326.2, Dec. 2, 2014, 6 pages, European Patent Office, Munich Germany.

M.J. Williams, B Khadhraui and I. Bradford, Quantitative interpretation of major planes from microseismic event locations with application in production prediction, SEG Technical Program Expanded Abstracts, Oct. 22, 2010, 5 pages, SEG Denver 2010 Annual Meeting, Denver.

* cited by examiner

| Family or Group | Planes | Events | Strike (°) Mean | Strike (°) STD | Dip (°) Mean | Dip (°) STD | Spacing (feet) Mean | Spacing (feet) STD |
|---|---|---|---|---|---|---|---|---|
| 290° | 7 | 53 | 290.10 | 0.38 | 78.85 | 10.77 | 110.9 | 135.8 |
| 312° | 10 | 79 | 311.9 | 1.25 | 76.73 | 8.01 | 123.4 | 156.1 |
| 358° | 14 | 89 | 358.0 | 0.36 | 79.02 | 9.13 | 131.7 | 173.1 |

SYSTEMS AND METHODS FOR HYDRAULIC FRACTURE CHARACTERIZATION USING MICROSEISMIC EVENT DATA

CROSS-REFERENCE TO RELATED APPLICATIONS

The priority of PCT Patent Application No. PCT/US2011/32741, filed on Apr. 15, 2011, is hereby claimed, and the specification thereof is incorporated herein by reference.

STATEMENT REGARDING FEDERALLY SPONSORED RESEARCH

Not applicable.

FIELD OF THE INVENTION

The present invention generally relates to systems and methods for hydraulic fracture characterization using microseismic event data. More particularly, the present invention relates to hydraulic fracture characterization using microseismic event data to identify the orientation, spacing and dip for subsurface fractures.

BACKGROUND OF THE INVENTION

Microseismic event data is sometimes acquired as part of the hydraulic fracturing treatment of a well that has been drilled for the purpose of developing hydrocarbon reserves. The data is acquired from low amplitude (micro) seismic events that are associated with fractures that have been induced by hydraulic fracturing. The purpose of the hydraulic fracturing is to induce an artificial fracture into the subsurface, by injecting high pressured fluids and proppants into the rock matrix, in order to enhance the productivity of the reservoir for hydrocarbons.

The microseismic event locations are commonly monitored in real-time and the locations of events shown in a three-dimensional (3D) view may be validated as they occur. They are also available for analysis after the conclusion of the hydraulic fracturing treatment and are thus, available to be compared to the results of other wells in the area. The microseismic events usually occur along or near subsurface fractures that may be either induced or preexisting natural fractures that have been reopened by the hydraulic fracturing treatment. The orientation of the fractures is strongly influenced by the present-day stress regime and also by the presence of fracture systems that were generated at various times in the past when the stress orientation was different from that at the present.

Each separate and distinct microseismic event that is detected and analyzed is the result of a downhole fracture, which has an orientation, magnitude, location and other attributes that can be extracted from a tiltmeter or seismic sensor data. The fracture may be characterized with other parameters such as length, width, height, and pressure, for example. There is a location uncertainty associated with each microseismic event. This uncertainty is different in the x-y direction than it is in the vertical (z) depth domain. The location uncertainty of each event may be represented by a prolate spheroid.

In some cases, there is an obvious orientation and spacing of microseismic events that follows the classical bi-wing fracture concepts that are often used in mathematical depictions of fracture analysis. In other cases, a dense data cloud, which represents the 3D volume that encompasses all of the microseismic datapoints, is evidence of a complex fracture pattern of induced or reactivated fractures. In these cases, the analysis of the microseismic data becomes very subjective and interpretive. Even in these cases, there are patterns within the data cloud that may be representative of the fracture patterns that are present in the subsurface.

The stress field today may be different from the one at the time of the original fracture creation. The present-day orientation of the induced hydraulic fractures is strongly influenced by the stress state in the subsurface. There is always some degree of stress anisotropy between the vertical stress and the two horizontal stresses. The greater the anisotropy, the more planar the fractures that are induced by hydraulic fracturing stimulation and the more they will fit the traditional bi-wing model. The greater the permeability of the rock, the more planar the fractures will be. The more isotropic the stress regime, the more the fractures can be easily deflected by discontinuities in the rock and can create a complex fracture network.

Currently, there are several fracture characterization techniques that have been used to try and identify the orientation, dip and spacing of induced and natural fractures.

In one technique, the overall data cloud of microseismic datapoints is identified to build a stimulated reservoir volume, SRV or estimated stimulated volume, ESV. The information is inferred to be a measure of the amount of rock that has been stimulated by the fluids and proppants. Only a small portion of the energy that is pumped into the ground, however, is ever received at the surface as detectable microseismic events. In fact, there are many microseismic events that are below the detection range of the instrumentation. Therefore, the use of the data cloud dimensions is only a guide and the results of such fracture characterization techniques may not be valid. Interpreting the fracture pattern based on a pattern of microseismic event data is another technique that is described in *Optimizing Horizontal Completion Technologies in the Barnett Shale Using Microseismic Fracture Mapping* by M. K. Fisher, et al. Surface seismic data (both active and passive) and analysis is yet another technique for fracture characterization. In some cases there may be a difference in the lateral variation of velocity that is related to the presence of fractures in the subsurface. The velocity is faster in some directions than it is in other directions. Converted waves (P to S for example) have also been used as fracture characterization techniques.

There are also several different fracture characterization techniques that are able to mathematically associate the microseismic event data with a model of the subsurface and produce a discrete fracture network (DFN) or a set of probable fracture characterizations such as, for example, the techniques described in U.S. Patent Application Publication Nos. 2010/0307755 and 0211/0029291.

An automated fracture characterization technique was proposed in *Quantitative interpretation of Major Planes From Microseismic Event Locations with Application in Production Prediction* by M. J. Williams, et al. to numerically analyze the data cloud and to identify the major planes from the microseismic datapoints for use in reservoir modeling. This technique approaches the problem of identifying the fracture trends from a probabilistic framework, however, only a single fracture orientation is identified.

SUMMARY OF THE INVENTION

The present invention therefore, meets the above needs and overcomes one or more deficiencies in the prior art by providing systems and methods for hydraulic fracture characterization using microseismic event data to identify the orientation, spacing and dip for subsurface fractures.

In one embodiment, the present invention includes a method for hydraulic fracture characterization using microseismic datapoints comprising: i) identifying one or more strike orientations of the average microseismic datapoints that relate to one or more sets of planes and their orientation uncertainty using a computer processor, the one or more strike orientations having, a greater number of the average microseismic datapoints at a respective strike orientation than a number of the average microseismic datapoints at other respective strike orientations; ii) determining a dip of each set of planes considering a contact weight between each microseismic datapoint and each plane within each set of planes; iii) determining a location of each plane within each set of planes; and iv) performing a statistical analysis for each set of planes with a common identified strike orientation to determine an uncertainty related to an orientation, spacing and dip of a respective set of subsurface fractures.

In another embodiment, the present invention includes a non-transitory program carrier device tangibly carrying computer executable instructions for hydraulic fracture characterization using microseismic datapoints, the instructions being executable to implement: i) identifying one or more strike orientations of the average microseismic datapoints that relate to one or more sets of planes and their orientation uncertainty, the one or more strike orientations having a greater number of the average microseismic datapoints at a respective strike orientation than a number of the average microseismic datapoints at other respective strike orientations; ii) determining a dip of each set of planes considering a contact weight between each microseismic datapoint and each plane within each set of planes; iii) determining a location of each plane within each set of planes; and iv) performing a statistical analysis for each set of planes with a common identified strike orientation to determine an uncertainty related to an orientation, spacing and dip of a respective set of subsurface fractures.

Additional aspects, advantages and embodiments of the invention will become apparent to those skilled in the art from the following description of the various embodiments and related drawings.

BRIEF DESCRIPTION OF THE DRAWINGS

The present invention is described below with references to the accompanying drawings in which like elements are referenced with like numerals and which.

DETAILED DESCRIPTION OF THE PREFERRED EMBODIMENTS

The subject matter of the present invention is described with specificity, however, the description itself is not intended to limit the scope of the invention. The subject matter thus, might also be embodied in other ways, to include different steps or combinations of steps similar to the ones described herein, in conjunction with other technologies. Moreover, although the term "step" may be used herein to describe different elements of methods employed, the term should not be interpreted as implying any particular order among or between various steps herein disclosed unless otherwise expressly limited by the description to a particular order. While the following description refers to the oil and gas industry, the systems and methods of the present invention are not limited thereto and may also be applied to other industries to achieve similar results.

Individual microseismic events that are induced by hydraulic fracturing produce microseismic event data that may be used to identify the orientation, spacing and dip of hydraulically induced and natural fractures that are present in the subsurface. Planes are defined and introduced into a three-dimensional volume. A minimum of three microseismic event intersections is required to define a plane. The intersection of each plane and a respective prolate spheroid, representing a location uncertainty in the x, y and z directions from each identified center point of the microseismic event data, may be calculated. The planes are rotated through the input data in a systematic way so that the orientation, dip and spacing of the microseismic event data can identify the most likely set of planes that fit the input data. Any fracture may be associated with any of the orientations and may be at the intersection of two or more families of fractures.

The likelihood that a true fracture plane in the subsurface has been identified by microseismic event data increases as the number of events that lie along the plane increases. The number of pre-existing fracture networks is not assumed since multiple geologic events may have generated several sets of overlapping fracture networks in any given area. The following method addresses how to identify the most likely orientation, spacing and dip of each individual fracture and fracture family, which may also be used to identify any correlations that are present in the microseismic event data.

Method Description

Figure 1A:
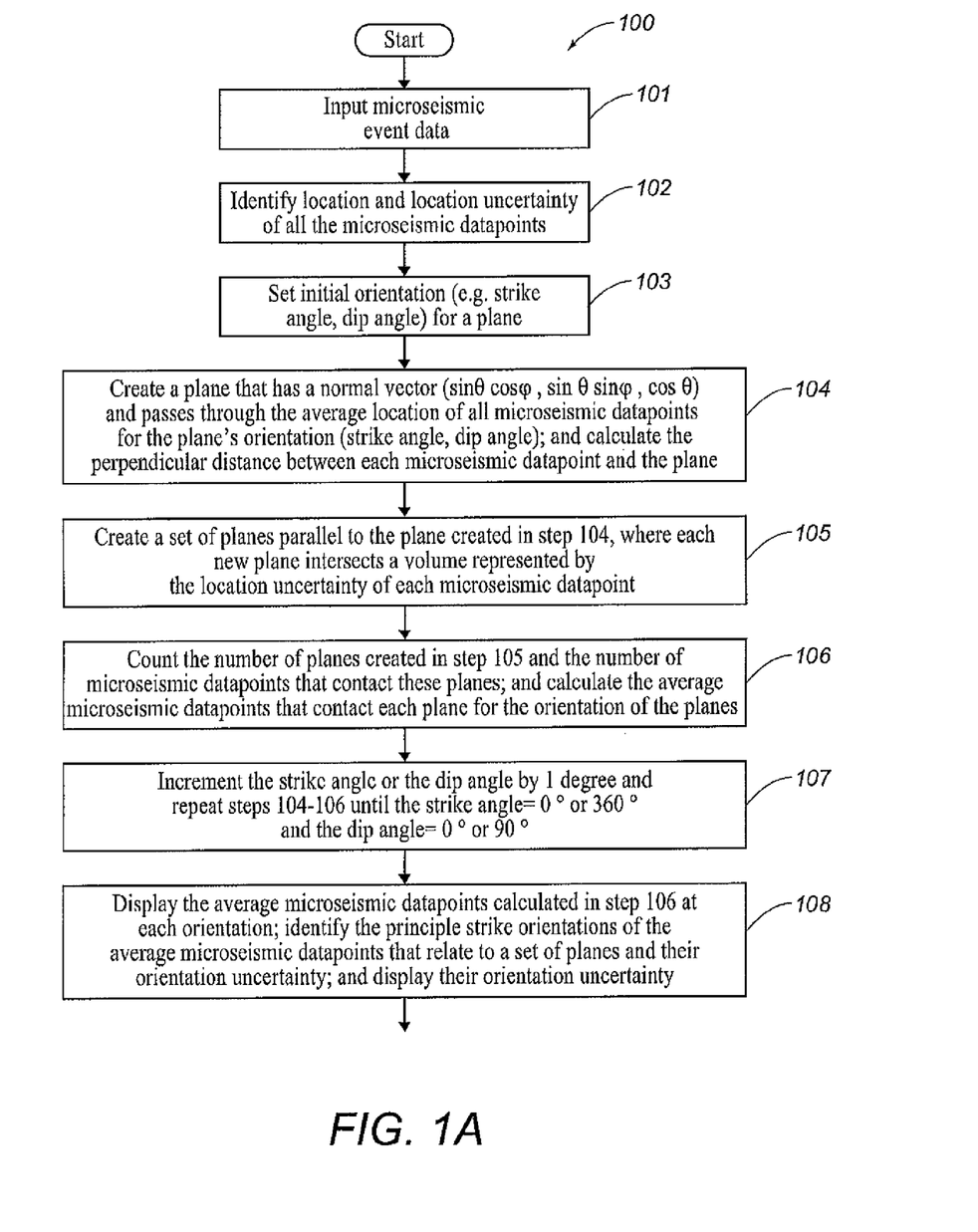
FIG. 1A is a flow diagram illustrating one embodiment of a method for implementing the present invention.
Figure 1B:
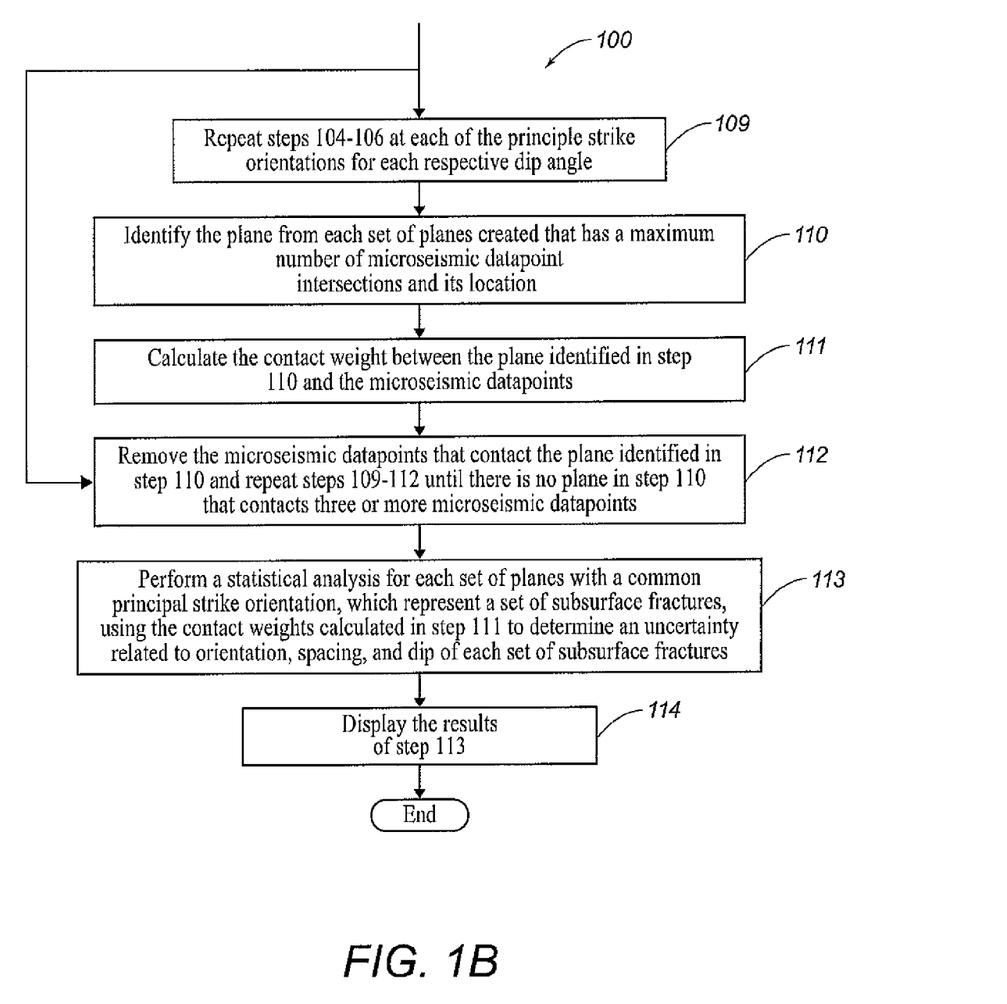
FIG. 1B is a continuation of the method illustrated in FIG. 1A.

Referring now to FIG. 1, a flow diagram illustrates one embodiment of a method 100 for implementing the present invention.

Figure 6:
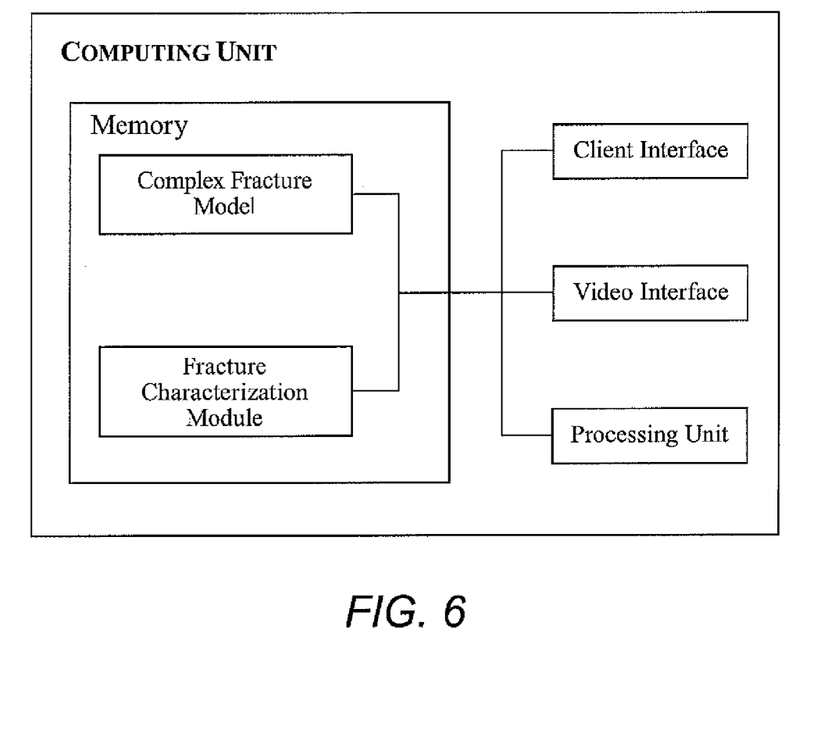
FIG. 6 is a block diagram illustrating one embodiment of a system for implementing the present invention.

In step 101, microseismic event data are input using the client interface/video interface described in reference to FIG. 6. Microseismic event data is collected from sensors as a result of a microseismic event induced naturally or by hydraulic fracturing. The microseismic event data may therefore, comprise multiple datasets possibly representing separate hydraulic fracturing events relating to one or more wells. The microseismic event data includes microseismic datapoints and information related to the x, y, z location of each microseismic datapoint and a location uncertainty associated with each x, y, z location. The microseismic event data may also include a moment magnitude and a moment tensor related to each microseismic datapoint. With respect to the location uncertainty for each microseismic datapoint, the location uncertainty may include individual x, y, z uncertainty values for each microseismic datapoint or an estimate of the same that may be applied to all microseismic datapoints. Optionally, other data related to the location of the sensors and their quality and velocity may be included as part of the microseismic event data. The microseismic event data may come from any of the available data sources including, but not limited to, tiltmeters, surface sensors or downhole sensors in one or more monitoring wells. Furthermore, the microseismic event data may be supplemented by the use of borehole data including, but not limited to, core, dipole, sonic logs or image logs. Oriented dipole sonic logs, for example, can indicate differences in the stress between the vertical and the maximum and minimum horizontal directions. Other data may be included and considered for purposes of the method 100 in the following steps.

In step 102, the location of all microseismic datapoints and their respective location uncertainty are identified using techniques well known in the art and the microseismic event data from step 101.

In step 103, the orientation (e.g. strike angle and dip angle) are set for a plane. For example, the strike angle and dip angle may be set (initialized) to 0° and 0°, or 360° and 0°, or 0° and 90°, or 360° and 90°, respectively.

In step 104, a plane is created that has a normal vector ($\sin \theta \cos \phi$, $\sin \theta \sin \phi$, $\cos \theta$) and passes through the average location of all microseismic datapoints for the plane's orientation (strike, dip). The perpendicular distance between each microseismic datapoint and the plane is also calculated using techniques well know in the art. Psi ($\phi$) represents the strike angle and theta ($\theta$) represents the dip angle. The perpendicular distance between each microseismic datapoint and the plane may be calculated by $d=(\bar{x}-x)\sin \theta \cos \phi+(\bar{y}-y)\sin \theta \sin \phi+(\bar{z}-z)\cos \theta$. The perpendicular distance between each microseismic datapoint and the plane therefore, has a sign that is positive on one side of the plane and that is negative on another side of the plane. Each microseismic datapoint is associated with a signed (±) perpendicular distance. A varying number of microseismic datapoints will thus, be associated with possible planes located at each signed distance. These will cluster into groups and may be associated with possible fracture planes.

In step 105, a set of planes is created that are parallel to the plane created in step 104 using techniques well known in the art, wherein each new plane intersects the volume represented by the location uncertainty of each microseismic datapoint.

In step 106, the number of planes created in step 105 and the number of microseismic datapoints that contact these planes are counted. The average microseismic datapoints that contact each plane for the orientation of the planes is also calculated using techniques well known in the art.

In step 107, the strike angle or dip angle for the plane created in step 104 is incremented by 1' and steps 104-106 are repeated until the strike angle equals 0° or 360° and the dip angle equals 0° or 90°. After steps 104-106 are repeated until the strike angle equals 0° or 360° and the dip angle equals 0° or 90°, the method 100 proceeds to step 108.

In step 108, the average microseismic datapoints calculated in step 106 at each orientation are displayed in order to identify the principal strike orientations of the average microseismic datapoints that relate to a set of planes and their orientation uncertainty using techniques well known in the art. The orientation uncertainty is also displayed for analysis. In this manner, the results of steps 104-107 for the various combinations of strike angle and dip angle are exhaustively processed, analyzed and displayed. Although numerous formats may be considered on a preferential basis to display the data in this step, the method 100 is not limited to a particular type of format and FIGS. 2A-2C and FIGS. 3A-3C illustrate different formats that may be displayed.

Figure 2A:
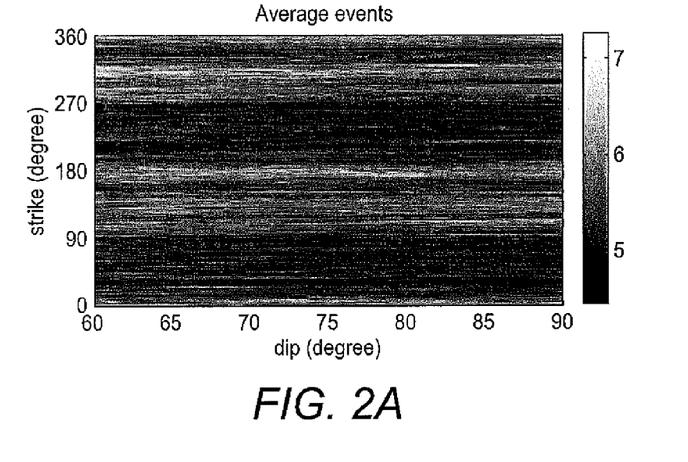
FIG. 2A illustrates one format for the display of the average microseismic datapoints at each orientation in step 108 of FIG. 1A.
Figure 2B:
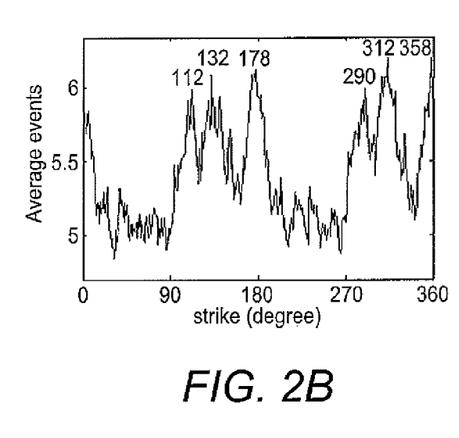
FIG. 2B illustrates another format for the display of the average microseismic datapoints at each orientation in step 108 of FIG. 1A.
Figure 2C:
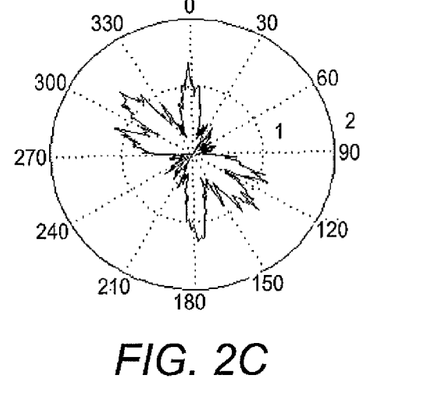
FIG. 2C illustrates yet another format for the display of the average microseismic datapoints at each orientation in step 108 of FIG. 1A.

In FIG. 2A, one format for a display of average microseismic datapoints at each orientation in step 108 is illustrated. The format in FIG. 2A is an exemplary plot of strike and dip of the average microseismic datapoints at each orientation. The microseismic datapoints at each plotted x-y point are shown in shades of grey. Three families of fracture planes with principal strike orientations of 112°, 132° and 178° are identified. In addition, the 112° fracture plane family has a preferred dip of about 84° compared to the 132° and 178° families, which have preferred dips somewhat less vertical in the range of 74°. FIG. 2B illustrates another format for the display of the average microseismic datapoints at each orientation. The format in FIG. 2B is a histogram of the average microseismic datapoints at each orientation compared to the strike. FIG. 2C illustrates yet another format for the display of the average microseismic datapoints at each orientation. The format in FIG. 2C is a radial plot of the average microseismic datapoints at each orientation.

Figure 3A:
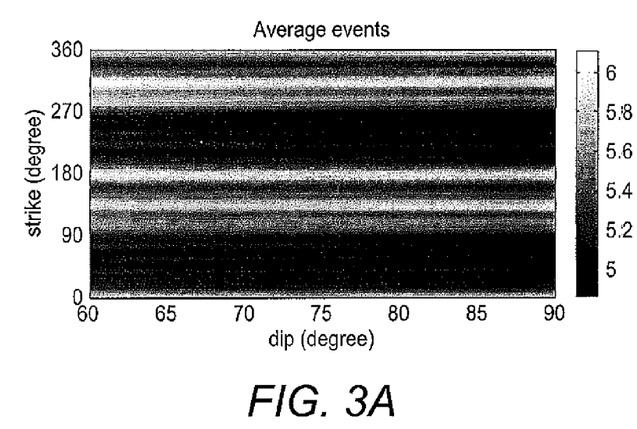
FIG. 3A illustrates the format in FIG. 2A for display after a standard statistical analysis using the Monte-Carlo method is completed.
Figure 3B:
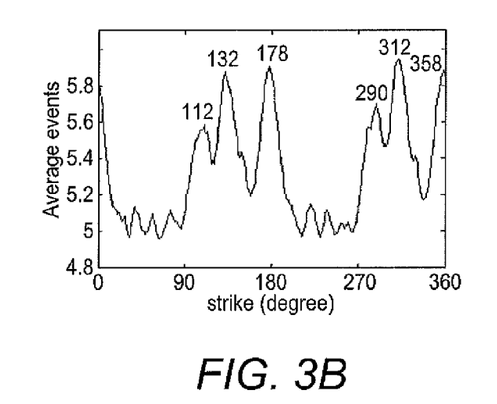
FIG. 3B illustrates the format in FIG. 2B for display after a standard statistical analysis using the Monte Carlo method is completed.
Figure 3C:
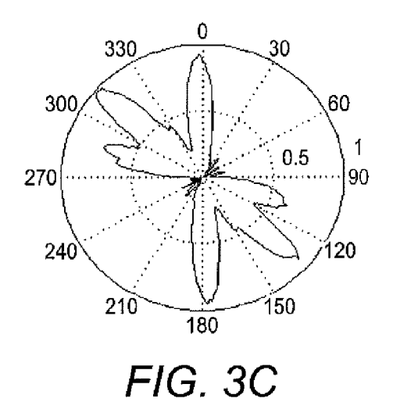
FIG. 3C illustrates the format in FIG. 2C for display after a standard statistical analysis using the Monte Carlo method is completed.

In FIG. 3A, the format in FIG. 2A is used to illustrate an analysis of the same data for display after a standard statistical analysis using the Monte Carlo method is completed. In other words, the orientation uncertainty or the principal strike orientation of the average microseismic datapoints that relate to a set of planes and their orientation uncertainty is displayed. In this manner, the principal strike orientations of the average microseismic datapoints that relate to a set of planes and their orientation uncertainty can be verified using the Monte Carlo statistical analysis. The uncertainty of each microseismic event in x, y, z directions follows a Gaussian distribution. A random process is applied to the x-location of each microseismic event by $x+\sigma_x N(0,1)$ where $\sigma_x$ is the radius of uncertainty in the x-direction and $N(0,1)$ is a normal distribution. A similar process is applied to the y and z locations. After all events are perturbed by this process, steps 104-107 are repeated to collect the average microseismic datapoints and plot the same in strike and dip spaces. After sampling multiple realizations, in-phase components in the map will stand out and out-of-phase components will cancel out. The principal strike orientations therefore, may be much more clearly identified. In FIG. 3B, the format in FIG. 2B is used to illustrate an analysis of the same data for display after a standard statistical analysis using the Monte Carlo method is completed. In FIG. 3C, the format in FIG. 2C is used to illustrate an analysis of the same data after a standard statistical analysis using the Monte Carlo method is completed.

In step 109, steps 104-106 are repeated at each principal strike orientation for each respective dip angle using the microseismic event data from step 101. In this manner, a detailed analysis of each plane at a principal strike orientation may be performed considering the uncertainty of the location and magnitude of each microseismic event.

In step 110, the plane from each set of planes created that has the maximum number of microseismic datapoint intersections and its location is identified using techniques well known in the art. This plane represents the plane with the best fit relative to the microseismic datapoints from step 101.

In step 111, the contact weight between the plane identified in step 110 and the intersecting microseismic datapoints is calculated based upon i) the location uncertainty of each microseismic datapoint in the x, y and z directions; ii) the perpendicular distance from the center of each microseismic datapoint to the plane; iii) a numerical weighted value that represents the moment magnitude of each individual microseismic event; and iv) the correlation among the microseismic datapoints and the plane. Each microseismic datapoint represents a volume with the highest degree of location certainty at the center and the lowest degree of location certainty at the edge. Microseismic datapoints with a higher moment magnitude have a greater degree of location certainty than do microseismic datapoints with a lower moment magnitude that may be barely detectable. A low moment magnitude therefore, represents microseismic datapoints that are the most uncertain as to their location. Thus, a high moment magnitude for a microseismic datapoint measured at its center location may be between 0.5 and 1. A value of 0.05 is assigned in all cases as the contact weight at the outer edge of an oblate spheroid defined by the uncertainties in the x, y and z directions. The value linearly decreases from the center location to the edge and represents the location uncertainty. The numerical value of the contact weight that is assigned to each microseismic datapoint is therefore, the product of i) a value corresponding to the confidence in the identification of each microseismic event as represented by the scaling applied to the moment magnitude; ii) the location uncertainty of each microseismic datapoint in the x, y and z directions; and iii) the perpendicular distance from the center location of the microseismic datapoint to the intersecting plane. The statistical correlation between the microseismic datapoints and the plane may be further analyzed using the reciprocal of the distance between the plane and the microseismic datapoints. If the microseismic datapoints lie in one fracture plane, the sum of these distances should be minimum.

In step 112, the microseismic datapoints that contact the plane identified in step 110 are removed and steps 109-112 are repeated until there is no plane in step 110 that contacts three or more microseismic datapoints. In this manner, the parameters of the plane are recorded. After all planes that contact three or more microseismic datapoints are individually identified, the method 100 proceeds to step 113.

In step 113, a statistical analysis is performed for each set of planes with a common principal strike orientation, which represent a set of subsurface fractures using the contact weights calculated in step 111 to determine an uncertainty related to orientation, spacing and dip of each set of subsurface fractures. The analysis may include, for example, basic statistics (mean, median and standard deviation of the strike, dip and length) that are calculated for each set of planes that have a common principal strike orientation.

In step 114, the results of step 113 are displayed. The uncertainty related to the orientation, spacing and dip of all potential subsurface fractures represented by each plane, in response to microseismic events during hydraulic fracturing, may be displayed to an analyst who may then accept or reject the results of the analysis based upon a geologic history of the area where the fractures may occur. Fractures may be present that were generated at an earlier geologic time when the stress regime may have been different from the one at present time. The analyst therefore, may consider knowledge of the geologic history of the area to identify any possible combinations of strike, dip and spacing that may not be valid in view of the fact that microseismic event data is not a complete description of hydraulic fractures—particularly when very small microseismic events may be below the resolution of the instrumentation capable of detecting such microseismic events. Furthermore, the sets of planes identified by the method 100 that have the greatest mathematical degree of fit may not be geologically reasonable and a different fit may be better for an overall analysis and fracture evaluation.

Figure 4:
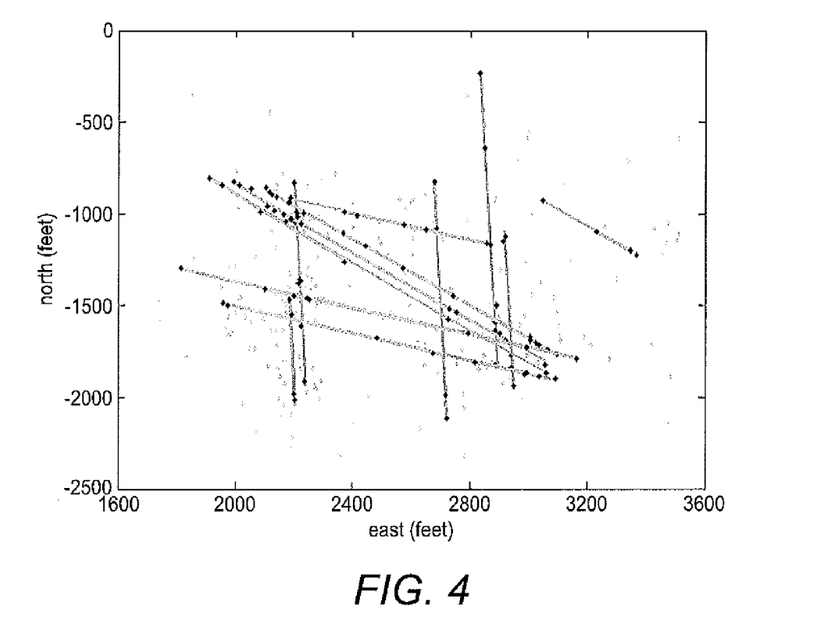
FIG. 4 illustrates an exemplary two-dimensional map of the optimal plane orientations and spacing for some of the vertical dip planes that represent a set of subsurface fractures in step 113 of FIG. 1B.
Figure 5:
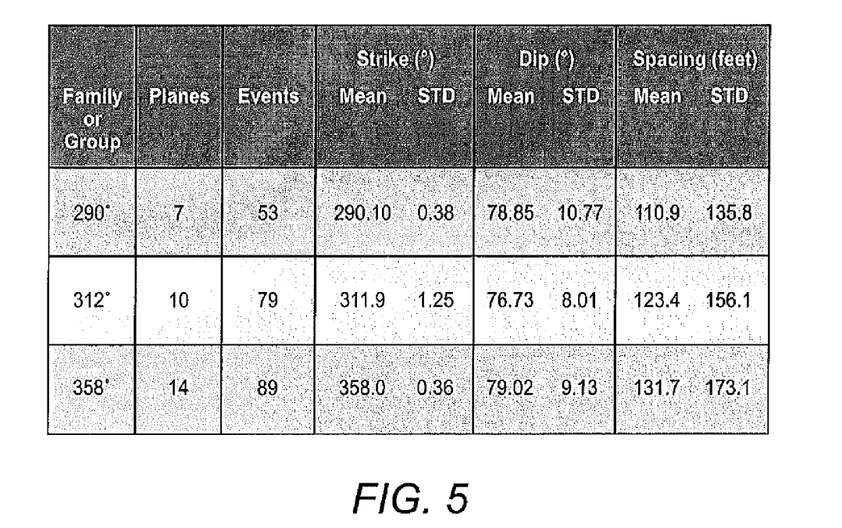
FIG. 5 is a table illustrating the statistics for the three families of planes illustrated in FIG. 4.

In FIG. 4, an exemplary two-dimensional map of the optimal plane orientations and spacing for some of the vertical dip planes that represent a set of subsurface fractures in step 113 is illustrated. The dataset represented by the map includes 284 microseismic events. Three principal strike orientations (290°, 312°, 358°) were selected to illustrate the analysis during steps 109-115. Complementary orientations were not selected for simplification. There are a total of 31 planes that are identified. Seven planes in the 290° family, 10 planes in the 312° family and 14 planes in 358° family. These planes include 221 of the microseismic events, which is 78% of the total microseismic events that were observed in this dataset. To visualize these planes, all microseismic events (gray dots) are projected onto an east, north plane (x,y-plane) in a vertical map view. Only 12 of the identified planes (gray lines) are illustrated, which have a dip angle greater than 85°. There are three planes matching microseismic events in the 290° family, four planes matching microseismic events in the 312° family and five planes matching microseismic events in the 358° family. The table in FIG. 5 illustrates statistics for the three families of planes illustrated in FIG. 4. The orientation (strike), dip and spacing for each family is displayed with the standard deviation (mean) for each.

The method 100 therefore, allows a more accurate identification of the various families of fracture trends. There may be multiple families of fractures in an area that was stimulated, each with a separate orientation, dip and spacing. This is especially true in the areas where complex fracture networks have been identified. The method 100 therefore, may be used for:

1) Input to a complex fracture model where the description of the fracture families and how they vary within a single well and from one well to another within an area are modeled;
2) Input into a mechanical earth model that contains stresses, rock parameters, layering and other information on the structure, stratigraphy and properties of the subsurface;
3) Input into well performance and reservoir models for single-well and multiple well analysis for production rates, drainage analysis and ultimate recovery analysis;
4) Real-time analysis using i) the identified fracture patterns from the first stimulation in subsequent stimulations to see if existing identified fractures continue to be reopened and whether new fracture trends are being intercepted by the fracturing in the well and ii) the data from the fracture families that were identified in other nearby wells to determine if the same fracture trends are being induced in the current stimulation; and
5) Analysis of the microseismic event data to determine any relationship between the moment magnitude and moment tensors of the individual microseismic events and the identified fracture plane orientations, spacing and dip families.

System Description

The present invention may be implemented through a computer-executable program of instructions, such as program modules, generally referred to as software applications or application programs executed by a computer. The software may include, for example, routines, programs, objects, components, and data structures that perform particular tasks or implement particular abstract data types. The software forms an interface to allow a computer to react according to a source of input. The software may also cooperate with other code segments to initiate a variety of tasks in response to data received in conjunction with the source of the received data. The software may be stored and/or carried on any variety of memory media such as CD-ROM, magnetic disk, bubble memory and semiconductor memory (e.g., various types of RAM or ROM). Furthermore, the software and its results may be transmitted over a variety of carrier media such as optical fiber, metallic wire and/or through any of a variety of networks such as the Internet.

Moreover, those skilled in the art will appreciate that the invention may be practiced with a variety of computer-system configurations, including hand-held devices, multiprocessor systems, microprocessor-based or programmable-consumer electronics, minicomputers, mainframe computers, and the like. Any number of computer-systems and computer networks are acceptable for use with the present invention. The invention may be practiced in distributed-computing environments where tasks are performed by remote-processing devices that are linked through a communications network. In a distributed-computing environment, program modules may be located in both local and remote computer-storage media including memory storage devices. The present invention may therefore, be implemented in connection with various hardware, software or a combination thereof, in a computer system or other processing system.

Referring now to FIG. 6, a block diagram illustrates one embodiment of a system for implementing the present invention on a computer. The system includes a computing unit, sometimes referred to a computing system, which contains memory, application programs, a client interface, a video interface and a processing unit. The computing unit is only one example of a suitable computing environment and is not intended to suggest any limitation as to the scope of use or functionality of the invention.

The memory primarily stores the application programs, which may also be described as program modules containing computer-executable instructions, executed by the computing unit for implementing the present invention described herein and illustrated in FIGS. 1-5. The memory therefore, includes a fracture characterization module, which enables the methods illustrated and described in reference to FIGS. 1A-1B. Although a complex fracture model may be used to utilize the results of the fracture characterization module, other interface applications may be used instead or the fracture characterization module may be used as a stand alone application.

Although the computing unit is shown as having a generalized memory, the computing unit typically includes a variety of computer readable media. By way of example, and not limitation, computer readable media may comprise computer storage media. The computing system memory may include computer storage media in the form of volatile and/or non-volatile memory such as a read only memory (ROM) and random access memory (RAM). A basic input/output system (BIOS), containing the basic routines that help to transfer information between elements within the computing unit, such as during start-up, is typically stored in ROM. The RAM typically contains data and/or program modules that are immediately accessible to and/or presently being operated on by the processing unit. By way of example, and not limitation, the computing unit includes an operating system, application programs, other program modules, and program data.

The components shown in the memory may also be included in other removable/non-removable, volatile/non-volatile computer storage media or they may be implemented in the computing unit through application program interface ("API"), which may reside on a separate computing unit connected through a computer system or network. For example only, a hard disk drive may read from or write to non-removable, nonvolatile magnetic media, a magnetic disk drive may read from or write to a removable, non-volatile magnetic disk, and an optical disk drive may read from or write to a removable, nonvolatile optical disk such as a CD ROM or other optical media. Other removable/non-removable, volatile/non-volatile computer storage media that can be used in the exemplary operating environment may include, but are not limited to, magnetic tape cassettes, flash memory cards, digital versatile disks, digital video tape, solid state RAM, solid state ROM, and the like. The drives and their associated computer storage media discussed above provide storage of computer readable instructions, data structures, program modules and other data for the computing unit.

A client may enter commands and information into the computing unit through the client interface, which may be input devices such as a keyboard and pointing device, commonly referred to as a mouse, trackball or touch pad. Input devices may include a microphone, joystick, satellite dish, scanner, or the like. These and other input devices are often connected to the processing unit through a system bus, but may be connected by other interface and bus structures, such as a parallel port or a universal serial bus (USB).

A monitor or other type of display device may be connected to the system bus via an interface, such as a video interface. A graphical user interface ("GUI") may also be used with the video interface to receive instructions from the client interface and transmit instructions to the processing unit. In addition to the monitor, computers may also include other peripheral output devices such as speakers and printer, which may be connected through an output peripheral interface.

Although many other internal components of the computing unit are not shown, those of ordinary skill in the art will appreciate that such components and their interconnection are well known.

While the present invention has been described in connection with presently preferred embodiments, it will be understood by those skilled in the art that it is not intended to limit the invention to those embodiments. It is therefore, contemplated that various alternative embodiments and modifications may be made to the disclosed embodiments without departing from the spirit and scope of the invention defined by the appended claims and equivalents thereof.

The invention claimed is:

1. A method for hydraulic fracture characterization using microseismic datapoints comprising: identifying one or more strike orientations of average microseismic datapoints that relate to one or more sets of planes and their orientation uncertainty using a computer processor, the one or more strike orientations having a greater number of the average microseismic datapoints at a respective strike orientation than a number of the average microseismic datapoints at other respective strike orientations; determining a dip of each set of planes considering a contact weight between each microseismic datapoint and each plane within each set of planes; determining a location of each plane within each set of planes; and performing a statistical analysis for each set of planes with a common identified strike orientation to determine an uncertainty related to an orientation, spacing and dip of a respective set of subsurface fractures.

2. The method of claim 1, further comprising identifying a location of all microseismic datapoints.

3. The method of claim 2, further comprising setting an initial orientation for a plane, the initial orientation comprising a strike angle and a dip angle.

4. The method of claim 3, wherein the identified strike orientations of the average microseismic datapoints that relate to one or more sets of planes and their orientation uncertainty are identified by:
  creating the plane that has a normal vector and passes through the average location of all microseismic datapoints for the orientation of the plane;
  calculating a perpendicular distance between each microseismic datapoint and the plane;
  creating a set of planes parallel to the plane wherein each plane in the set of planes intersects a volume represented by a location uncertainty of each microseismic datapoint;
  counting the number of planes in the set of planes and the number of microseismic datapoints that contact the planes in the set of planes;
  calculating the average microseismic datapoints that contact each plane in the set of planes for each orientation of the planes in the set of planes;
  incrementing the strike angle or the dip angle of the plane by 1 degree; and
  repeating each of the prior steps until the strike angle equals 0 degrees or 360 degrees and the dip angle equals 0 degrees or 90 degrees.

5. The method of claim 4, wherein the dip angle for each set of planes and the location of each plane within each set of planes is determined by:
  repeating each step in claim 4 at each of the identified strike orientations for each respective dip angle;
  identifying the plane from each set of planes created that has a maximum number of microseismic datapoint intersections and its location;
  calculating a contact weight between the plane with the maximum number of microseismic datapoint intersections and the microseismic datapoints;
  removing the microseismic datapoints that contact the plane with the maximum number of microseismic datapoint intersections; and
  repeating each of the prior steps until there is no plane with the maximum number of microseismic datapoint intersections that contacts three or more microseismic datapoints.

6. The method of claim 1, wherein the orientation uncertainty of the one or more sets of planes is determined by performing a Monte Carlo statistical analysis.

7. The method of claim 5, wherein the uncertainty related to the orientation, spacing and dip of each respective set of subsurface fractures is calculated considering the contact weight for each set of planes and the microseismic datapoints that are related to each set of planes.

8. The method of claim 5, wherein the contact weight is based upon the location uncertainty of each microseismic datapoint, the perpendicular distance between each microseismic datapoint and the plane and a numerical weighted value that represents a moment magnitude associated with each microseismic datapoint.

9. The method of claim 5, wherein the contact weight is assigned to each respective microseismic datapoint.

10. The method of claim 1, further comprising displaying the statistical analysis.

11. A non-transitory program carrier device tangibly carrying computer executable instructions for hydraulic fracture characterization using microseismic datapoints, the instructions being executable to implement:
  identifying one or more strike orientations of average microseismic datapoints that relate to one or more sets of planes and their orientation uncertainty, the one or more strike orientations having a greater number of the average microscismic datapoints at a respective strike orientation than a number of the average microseismic datapoints at other respective strike orientations;
  determining a dip of each set of planes considering a contact weight between each microseismic datapoint and each plane within each set of planes;
  determining a location of each plane within each set of planes; and
  performing a statistical analysis for each set of planes with a common identified strike orientation to determine an uncertainty related to an orientation, spacing and dip of a respective set of subsurface fractures.

12. The program carrier device of claim 11, further comprising identifying a location of all microseismic datapoints.

13. The program carrier device of claim 12, further comprising setting an initial orientation for a plane, the initial orientation comprising a strike angle and a dip angle.

14. The program carrier device of claim 13, wherein the identified strike orientations of the average microseismic datapoints that relate to one or more sets of planes and their orientation uncertainty are identified by:
  creating the plane that has a normal vector and passes through the average location of all microseismic datapoints for the orientation of the plane;
  calculating a perpendicular distance between each microseismic datapoint and the plane;
  creating a set of planes parallel to the plane wherein each plane in the set of plane intersects a volume represented by a location uncertainty of each microseismic datapoint;
  counting the number of planes in the set of planes and the number of microseismic datapoints that contact the planes in the set of planes;
  calculating the average microseismic datapoints that contact each plane in the set of planes for each orientation of the planes in the set of planes;
  incrementing the strike angle or the dip angle of the plane by 1 degree; and
  repeating each of the prior steps until the strike angle equals 0 degrees or 360 degrees and the dip angle equals 0 degrees or 90 degrees.

15. The program carrier device of claim 14, wherein the dip angle for each set of planes and the location of each plane within each set of planes is determined by:
  repeating each step in claim 14 at each of the identified strike orientations for each respective dip angle;
  identifying the plane from each set of planes created that has a maximum number of microseismic datapoint intersections and its location;
  calculating a contact weight between the plane with the maximum number of microseismic datapoint intersections and the microseismic datapoints;
  removing the microseismic datapoints that contact the plane with the maximum number of microseismic datapoint intersections; and repeating each of the prior steps until there is no plane with the maximum number of microseismic datapoint intersections that contacts three or more microseismic datapoints.

16. The program carrier device of claim 11, wherein the orientation uncertainty of the one or more sets of planes is determined by performing a Monte Carlo statistical analysis.

17. The program carrier device of claim 15, wherein the uncertainty related to the orientation, spacing and dip of each respective set of subsurface fractures is calculated considering the contact weight for each set of planes and the microseismic datapoints that are related to each set of planes.

18. The program carrier device of claim 15, wherein the contact weight is based upon the location uncertainty of each microseismic datapoint, the perpendicular distance between each microseismic datapoint and the plane and a numerical weighted value that represents a moment magnitude associated with each microseismic datapoint.

19. The program carrier device of claim 15, wherein the contact weight is assigned to each respective microseismic datapoint.

20. The program carrier device of claim 11, further comprising displaying the statistical analysis.

* * * * *